United States Patent
Yang et al.

(10) Patent No.: US 12,407,355 B2
(45) Date of Patent: Sep. 2, 2025

(54) DIGITAL-TO-ANALOG CONVERSION CIRCUIT AND METHOD

(71) Applicant: SHENZHEN PANGO MICROSYSTEMS CO., LTD., Shenzhen (CN)

(72) Inventors: Li Yang, Shenzhen (CN); Qianwen Zhang, Shenzhen (CN); Changqing Wen, Shenzhen (CN); Aimei Liang, Shenzhen (CN)

(73) Assignee: SHENZHEN PANGO MICROSYSTEMS CO., LTD., Shenzhen (CN)

( * ) Notice: Subject to any disclaimer, the term of this patent is extended or adjusted under 35 U.S.C. 154(b) by 222 days.

(21) Appl. No.: 18/343,749

(22) Filed: Jun. 29, 2023

(65) Prior Publication Data

US 2023/0344435 A1    Oct. 26, 2023

Related U.S. Application Data

(63) Continuation of application No. PCT/CN2021/079754, filed on Mar. 9, 2021.

(30) Foreign Application Priority Data

Dec. 31, 2020   (CN) ......................... 202011627453.9

(51) Int. Cl.
H03M 1/78      (2006.01)
H03M 1/06      (2006.01)

(52) U.S. Cl.
CPC .................. H03M 1/0604 (2013.01)

(58) Field of Classification Search
CPC .... H03M 1/785; H03M 1/687; H03M 1/1057; H03M 1/808; H03M 1/0682;
(Continued)

(56) References Cited

U.S. PATENT DOCUMENTS 4,267,550 A  *  5/1981  Cecil .................... H03M 1/785
                                                        341/118
5,568,147 A  *  10/1996 Matsuda ............... H03M 1/687
                                                        341/145
(Continued)

FOREIGN PATENT DOCUMENTS

CN       102142840 A      8/2011
CN       103997344 A      8/2014
(Continued)

OTHER PUBLICATIONS

JPO, Office Action for JP Application No. 2023-527403, Sep. 24, 2024 (12 pages).

(Continued)

*Primary Examiner* — Linh V Nguyen

(57) ABSTRACT

Provided are a digital-to-analog conversion circuit and method. The digital-to-analog conversion circuit includes a conversion unit and a first regulating unit. The conversion unit includes a first code value receiving terminal used to receive a first code value, and the conversion unit is used to convert the first code value into an analog signal. The first regulating unit includes a second code value receiving terminal used to receive a second code value. A signal input terminal of the first regulating unit is connected to a signal output terminal of the conversion unit. The first regulating unit is used to acquire a first analog regulation signal according to the second code value, and regulate, by using the first analog regulation signal, an analog signal transmitted by the conversion unit.

16 Claims, 10 Drawing Sheets

(58) Field of Classification Search
CPC ...... H03M 1/765; H03M 1/00; H03M 1/0675; H03M 1/069; H03M 1/12; H03M 1/66; H03M 1/664; H03M 1/70; H03M 1/747
USPC .................................................. 341/144, 154
See application file for complete search history.

(56) References Cited

U.S. PATENT DOCUMENTS

| | | | | |
|---|---|---|---|---|
| 6,384,763 | B1* | 5/2002 | Leung | H03M 1/0602 341/154 |
| RE38,083 | E* | 4/2003 | Ashe | H03M 1/70 341/154 |
| 7,256,721 | B2* | 8/2007 | Copley | H03M 1/1057 341/145 |
| 7,414,561 | B1* | 8/2008 | Brubaker | H03M 1/0682 341/145 |
| 8,704,692 | B2* | 4/2014 | Sawada | H03M 1/068 341/154 |
| 9,276,598 | B1* | 3/2016 | Li | H03M 1/1057 |
| 2011/0089988 | A1 | 4/2011 | Lin | |
| 2011/0241920 | A1* | 10/2011 | Mori | H03M 1/1061 341/153 |
| 2014/0266836 | A1* | 9/2014 | Price | H03M 1/68 341/145 |
| 2015/0097712 | A1* | 4/2015 | Downey | H03M 1/069 341/144 |
| 2020/0099389 | A1* | 3/2020 | Sung | H03M 1/785 |
| 2020/0373042 | A1 | 11/2020 | Potasek | |
| 2023/0238973 | A1* | 7/2023 | Neema | H03M 1/785 341/118 |

FOREIGN PATENT DOCUMENTS

| | | |
|---|---|---|
| CN | 104184474 A | 12/2014 |
| CN | 104247270 A | 12/2014 |
| CN | 107994904 A | 5/2018 |
| JP | S52140259 A | 11/1977 |
| JP | H03238927 A | 10/1991 |
| JP | H07193504 A | 7/1995 |
| JP | H0846515 A | 2/1996 |
| JP | H10242861 A | 9/1998 |

OTHER PUBLICATIONS

WIPO International Search Report for PCT Application No. PCT/CN2021/079754, Jul. 13, 2021.
CNINA, First Office Action for CN Application No. 202011627453.9, Sep. 26, 2021.
CNINA, Office Action issued for CN Application No. 202011627453.9, Mar. 15, 2022.
JPO, Office Action for JP Application No. 2023-527403, Apr. 2, 2024 (18 pages).
JPO, Office Action issued for JP Application No. 2023-527403, Mar. 11, 2025 (6 pages).

* cited by examiner

Receive a first code value, and convert it into an analog signal — S210

Adjust the analog signal to obtain a target signal — S220

DIGITAL-TO-ANALOG CONVERSION CIRCUIT AND METHOD

CROSS-REFERENCING OF RELEVANT APPLICATIONS

The present disclosure is a continuation of International Application PCT/CN2021/079754 filed on Mar. 9, 2021, which claims priority to a Chinese Patent Application No. 202011627453.9 filed on Dec. 31, 2020. The entire contents of these applications are incorporated herein by reference.

TECHNICAL FIELD

Embodiments of the present disclosure relate to the field of integrated circuit design, and in particular to, but is not limited to, a digital-to-analog conversion circuit and method.

BACKGROUND

A Digital-to-Analog converter, also referred to as D/A or DAC, is mainly used to convert a digital signal or a discrete signal into an analog signal. The digital signal is a set of parallel encoded signals generated by a digital signal system. The digital-to-analog converter converts the encoded signal generated by the digital signal system into an equivalent analog signal, under the action of a reference voltage. And the converted analog signal enters an analog signal system after being filtered and amplified. Therefore, how to enable the digital-to-analog converter to convert a digital signal into an accurate analog signal is an urgent problem to be solved.

SUMMARY

In a first aspect, the embodiments of the present disclosure provide a digital-to-analog conversion circuit. The digital-to-analog conversion circuit includes a conversion unit and a first adjustment unit. The conversion unit includes a first code value receiving terminal used to receive a first code value, and the conversion unit is used to convert the first code value into an analog signal. The first adjustment unit includes a second code value receiving terminal used to receive a second code value. A signal input terminal of the first adjustment unit is connected to a signal output terminal of the conversion unit. The first adjustment unit is used to obtain a first analog adjustment signal according to the second code value, and adjust, with the first analog adjustment signal, the analog signal transmitted from the conversion unit, to obtain a target signal.

In a second aspect, the embodiments of the present disclosure further provide a digital-to-analog conversion method, where the method is applied to the digital-to-analog conversion circuit in the first aspect. The method includes: receiving a first code value and converting the first code value into an analog signal; and adjusting the analog signal to obtain a target signal.

Other features and corresponding beneficial effects of the present disclosure are illustrated in the following part of the specification. It is understandable that at least part of the beneficial effects become apparent from the description of the present disclosure.

DETAILED DESCRIPTION OF EMBODIMENTS

Figure 1:
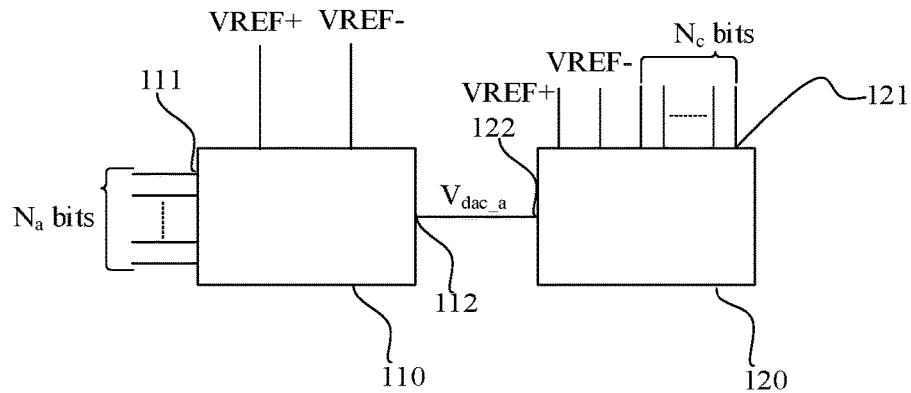
FIG. 1 is a schematic structural diagram of a digital-to-analog conversion circuit according to an embodiment of the present disclosure.

To illustrate the technical schemes in the embodiments of the present disclosure clearly, the drawings used in the description of the embodiments are briefly introduced below. Apparently, the drawings in the following description are merely some embodiments of the present disclosure. For those skilled in the art, other drawings may be obtained according to these drawings without paying any creative effort.

The existing digital-to-analog converters may be classified into current proportional type, voltage proportional type, and charge proportional type digital-to-analog converters. The current proportional type digital-to-analog converter sums up accurate current sources in a simple way or using binary weights. The current proportional type digital-to-analog converter has advantages of fast speed and large drive, but these advantages bring disadvantages, such as a large range of values and poor matching of elements. In the charge proportional type digital-to-analog converter, an array of parallel capacitors with binary weights are utilized, and a reference voltage is divided. The charge proportional type digital-to-analog converter has the advantages of fast speed and high accuracy, but also has the disadvantage of a large range of values of the elements. In the voltage proportional type digital-to-analog converter, voltage division through series resistors or parallel resistors are utilized, and the voltages are summed. The voltage proportional type digital-to-analog converter has advantages of simple structure and monotonicity, but these advantages also bring disadvantages of large area and low speed. In summary, the three types of digital-to-analog convers, namely the current proportional type, the voltage proportional type, and charge proportional type, all have a characteristic of a single and non-adjustable output voltage range, and all of them have some limitations when performing the digital-to-analog conversion.

In view of the above issues, the inventor proposes the digital-to-analog conversion circuit and method according to the embodiments of the present disclosure, which mainly aim at a technical problem of how to simply and effectively adjust the range of an analog voltage signal obtained through digital-to-analog conversion. In the embodiments of the present disclosure, by introducing a first adjustment unit, the range of a voltage obtained through digital-to-analog conversion can be simply and effectively adjusted.

In an embodiment, a digital-to-analog conversion circuit is provided. The digital-to-analog conversion circuit includes a conversion unit and a first adjustment unit. The conversion unit includes a first code value receiving terminal used to receive a first code value, and the conversion unit is used to convert the first code value into an analog signal. The first adjustment unit includes a second code value receiving terminal used to receive a second code value. A first signal input terminal of the first adjustment unit is connected to a signal output terminal of the conversion unit. The first adjustment unit is used to obtain a first analog adjustment signal according to the second code value, and adjust, with the first analog adjustment signal, the analog signal transmitted from the conversion unit, to obtain a target signal.

In an implementation, the digital-to-analog conversion circuit further includes a second adjustment unit. The second adjustment unit includes a third code value receiving terminal used to receive a third code value. A signal output terminal of the second adjustment unit is connected to a second signal input terminal of the first adjustment unit. The second adjustment unit is used to obtain a second analog signal according to the third code value, and adjust, with the second analog signal, the analog signal transmitted by the conversion unit.

In an implementation, the second adjustment unit includes n first resistor-selection sub-units, a first resistor is provided between every two adjacent first resistor-selection sub-units, and the first resistor is electrically connected to its adjacent first resistor-selection sub-units.

In an implementation, each of the first resistor-selection sub-units includes a second resistor and a first switch element. A control terminal of the first switch element is used to receive the third code value, a second connection terminal of the first switch element is connected to a first connection terminal of the second resistor, and a second connection terminal of the second resistor is connected to the first resistor.

In an implementation, the first switch element includes a first inverter, a first PMOS transistor, and a first NMOS transistor. An input terminal of the first inverter is used to receive the third code value, and an output terminal of the first inverter is connected to each of a gate of the first PMOS transistor and a gate of the first NMOS transistor. A source of the first PMOS transistor is connected to a positive pole terminal of a reference voltage, a drain of the first PMOS transistor is connected to a drain of the first NMOS transistor, and a source of the first NMOS transistor is connected to a negative pole terminal of the reference voltage.

In an implementation, the conversion unit includes m second resistor-selection sub-units, a third resistor is provided between every two adjacent second resistor-selection sub-units, and the third resistor is electrically connected to its adjacent second resistor-selection sub-units.

In an implementation, each of the second resistor-selection sub-units includes a fourth resistor and a second switch element. A control terminal of the second switch element is used to receive the first code value, a second connection terminal of the second switch element is connected to a first connection terminal of the fourth resistor, and a second connection terminal of the fourth resistor is connected to the third resistor.

In an implementation, the second switch element includes a second inverter, a second PMOS transistor, and a second NMOS transistor. An input terminal of the second inverter is used to receive the first code value, and an output terminal of the second inverter is connected to each of a gate of the second PMOS transistor and a gate of the second NMOS transistor. A source of the second PMOS transistor is connected to the positive pole terminal of the reference voltage, a drain of the second PMOS transistor is connected to a drain of the second NMOS transistor, and a source of the second NMOS transistor is connected to the negative pole terminal of the reference voltage.

In an implementation, the first adjustment unit includes k third resistor-selection sub-units. Each of the third resistor-selection sub-unit includes a third switch element and a fifth resistor, and the third switch element is connected to the fifth resistor.

In an implementation, the third switch element includes a third inverter, a third PMOS transistor, and a third NMOS transistor. An input terminal of the third inverter is used to receive the second code value, an output terminal of the third inverter is connected to a gate of the third PMOS transistor, a source of the third PMOS transistor is connected to a drain of the third NMOS transistor, and a drain of the third PMOS transistor is connected to a source of the third NMOS transistor.

In an embodiment, a digital-to-analog conversion method is provided, where the method is applied to the digital-to-analog conversion circuit mentioned above. The method includes: receiving a first code value and converting the first code value into an analog signal; and adjusting the analog signal to obtain a target signal.

In an implementation, the adjusting the analog signal to obtain a target signal includes: obtaining a digital-to-analog adjustment list, and obtaining, based on the digital-to-analog adjustment list, the target signal corresponding to the analog signal. The digital-to-analog adjustment list is obtained by obtaining multiple full-code-value digital signals and adjusting analog signals corresponding to the multiple full-code-value digital signals.

In an implementation, the adjusting, by the first adjustment unit, the analog signal to obtain a target signal, includes: receiving, by the first adjustment unit, a second code value; obtaining a first analog adjustment signal according to the second code value; and adjusting, with the first analog adjustment signal, the analog signal obtained from the conversion unit, to obtain a target signal.

In an implementation, the digital-to-analog conversion circuit further includes a second adjustment unit, and the method further includes: receiving, by the second adjustment unit, a third code value; obtaining a second analog signal according to the third code value; and adjusting, with the second analog signal, the analog signal obtained by the conversion unit.

In an implementation, the second adjustment unit includes n first resistor-selection sub-units, and a first resistor is electrically connected between every two adjacent first resistor-selection sub-units. Each of the first resistor-selection sub-units includes a second resistor and a first switch element, a control terminal of the first switch element is configured to receive a bit of the third code value, a second connection terminal of the first switch element is connected to a first connection terminal of the second resistor, and a second connection terminal of the second resistor is connected to the first resistor. The method further includes: in response to detecting that the received bit is 0, controlling the first switch element to be turned off and connected to a negative pole terminal of a reference voltage; and in response to detecting that the received bit is 1, controlling the first switch element to be turned on and connected to a positive pole terminal of the reference voltage.

In an implementation, the conversion unit includes m second resistor-selection sub-units, and a third resistor is electrically connected between every two adjacent second resistor-selection sub-units. Each of the second resistor-selection sub-units includes a fourth resistor and a second switch element, a control terminal of the second switch element is configured to receive a bit of the first code value, a second connection terminal of the second switch element is connected to a first connection terminal of the fourth resistor, and a second connection terminal of the fourth resistor is connected to the third resistor. The method further includes: in response to detecting that the received bit is 0, controlling the second switch element to be turned off and connected to a negative pole terminal of a reference voltage, and in response to detecting that the received bit is 1, controlling the second switch element to be turned on and connected to a positive pole terminal of a reference voltage.

In an implementation, the first adjustment unit includes k third resistor-selection sub-units, each of the third resistor-selection sub-units includes a third switch element and a fifth resistor connected in parallel to each other, and a control terminal of each third switch element is configured to receive a bit of the second code value. The method further includes: in response to detecting that the received bit is 0, controlling the third switch element to be turned off; and in response to detecting that the received bit is 1, controlling the third switch element to be turned on, to make the fifth resistor connected in parallel to the third switch element be short circuited.

In the digital-to-analog conversion circuit provided by the embodiments of the present disclosure, a conversion unit and a first adjustment unit are incorporated to simply and effectively adjust a voltage range. Specifically, the digital-to-analog conversion circuit may include the conversion unit and the first adjustment unit. Among them, the conversion unit may include a first code value receiving terminal used to receive a first code value, and the conversion unit is used to convert the first code value into an analog signal. The first adjustment unit may include a second code value receiving terminal used to receive a second code value, a signal input terminal of the first adjustment unit is connected to a signal output terminal of the conversion unit, and the first adjustment unit is used to obtain a first analog adjustment signal based on the second code value, and adjust, with first analog adjustment signal, the analog signal transmitted from the conversion unit, to obtain a target signal. In the present disclosure, after the conversion unit converts the received first code value into the analog signal, the analog signal may be adjusted by the first adjustment unit, which can make the finally obtained target signal accurate and effective.

Referring to FIG. 1, a schematic structural diagram of a digital-to-analog conversion circuit according to an embodiment of the present disclosure is illustrated. As illustrated in FIG. 1, the digital-to-analog conversion circuit 100 may include a conversion unit 110 and a first adjustment unit 120.

In an implementation, the conversion unit 110 may include a first code value receiving terminal 111. The first code value receiving terminal 111 is used to receive a first code value. The conversion unit 110 is used to convert the first code value into an analog signal. The $N_a$ bits illustrated in FIG. 1 may be referred to as the first code value, and $V_{dac\_a}$ is the converted analog signal which may also be referred to as an output voltage of the conversion unit. The first code value may be a set of parallel coded signals generated by a digital signal system, and it may be a binary code value. For example, the first code value may be a binary code value of two bits, a binary code value of four bits, a binary code value of eight bits, or a binary code value of sixteen bits. The specific number of the bits is not explicitly limited here, and it may be chosen based on actual situations. In addition, the first code value may also be a binary code value input by the user according to his/her needs. For example, when the user wants to convert a digital signal 011 into an analog signal, he/she may input 011 into the conversion unit 110, and obtain the converted analog signal through the conversion unit 110.

In the embodiment of the present disclosure, the conversion unit 110 may be constituted by multiple switches and unit resistors, and the number of the switches and the number of the resistors are determined by the first code value. The first code value ranges from 0 to $2^{N_a}-1$, and $2^{N_a}$ analog output voltages may be obtained, where $N_a$ may be the number of the binary bits. For example, when the first code value is 1011, the corresponding $N_a$ is 4.

In addition, as illustrated in FIG. 1, besides the first code value receiving terminal 111, the conversion unit 110 may further include a signal output terminal 112, as well as a positive pole terminal and a negative pole terminal of a reference voltage. The positive pole terminal of the reference voltage is $V_{REF+}$ illustrated in FIG. 1, and the negative pole terminal of the reference voltage is $V_{REF-}$ illustrated in FIG. 1. In the embodiments of the present disclosure, the positive pole terminal of the reference voltage and the negative pole terminal of the reference voltage have a certain ability of driving, that is, the positive pole terminal of the reference voltage and the negative pole terminal of the reference voltage may provide an output current. The range of the voltage of analog signal output by the conversion unit 110 is determined by the range between $V_{REF+}$ and $V_{REF-}$ of the reference voltage, that is $(V_{REF+})-(V_{REF-})$.

In some embodiments, the first code value generated by the digital signal system may be constituted by $m_a$ "0" and $n_a$ "1", where $m_a+n_a=N_a$. When there is a "0" in the first code value, a corresponding internal switch of the conversion unit 110 is connected to the negative pole terminal of the reference voltage $V_{REF-}$; and when there is a "1" in the first code value, a corresponding internal switch of the conversion unit 110 is connected to the positive pole terminal of the reference voltage $V_{REF+}$. Through the switches, a range of series or parallel resistors exist between $V_{REF+}$ and $V_{REF-}$, and an analog voltage signal proportional to $(V_{REF+})-(V_{REF-})$ is obtained at the signal output terminal 112.

In an implementation, when $m_a=N_a$ and $n_a=0$, the output of the conversion unit 110 is minimum, and all the bits of the first code value in this case are 0. For example, when $m_a=4$ and $n_a=0$, the corresponding first code value is 0000. In addition, when $m_a=0$ and $n_a=N_a$, the output of the conversion unit 110 is maximum, and all the bits of the first code value in this case are 1. For example, when $m_a=0$ and $n_a=4$, the corresponding first code value is 1111. The lowest significant bit (LSB) of the conversion unit 110 is the lowest bit of the $N_a$ bits, and the minimum variation in output corresponding to the lowest bit is $$1LSB = \frac{V_{REF_+} + V_{REF_-}}{2^{N_a}}.$$

The maximum analog output voltage is a full-scale voltage $$V_{FS\_a} = \frac{2^{N_a} - 1}{2^{N_a}}(V_{REF_+} + V_{REF_-}).$$

In the embodiment of the present disclosure, the first adjustment unit 120 may include a second code value receiving terminal 121. The second code value receiving terminal 121 is used to receive a second code value. A signal input terminal 122 of the first adjustment unit 120 is connected to the signal output terminal 112 of the conversion unit 110. The first adjustment unit 120 is used to obtain a first analog adjustment signal based on the second code value, and adjust, with the first analog adjustment signal, the analog signal transmitted from the conversion unit 100, to obtain a target signal.

As illustrated in FIG. 1, the $N_c$ bits may be referred to as the second code value. The second code value may also be a set of parallel coded signals generated by the digital signal system, and it may be a binary code value. For example, the second code value may be a binary code value of two bits, a binary code value of eight bits, or a sixteen-bit binary code value of sixteen bits, where the specific number of the bits is not specific ally limited here, and it may be chosen based on the actual situations. In addition, the second code value may also be a binary code value input by the user according to his/her needs.

In the embodiment of the present disclosure, the first adjustment unit 120 may be constituted by multiple switches and unit resistors. As can be seen from FIG. 1, besides the second code value receiving terminal 121, the first adjustment unit 120 may further include a signal input terminal 122, as well as a positive pole terminal and a negative pole terminal of a reference voltage. As illustrated in FIG. 1, the positive pole terminal of the reference voltage is $V_{REF+}$, and the negative pole terminal of the reference voltage is $V_{REF-}$.

In an implementation, a first input of the first adjustment unit 120 is the binary code value of the $N_c$ bits, and the binary code value of the $N_c$ bits is the second code value. The highest bit of the second code value (the code value of $N_c$ bits) is used to select the output range of the conversion unit 110, and the remaining ($N_c$-1) bits are used to adjust the value of the LSB voltage of the conversion unit 110. By adjusting the ($N_c$-1) bits, $2^{N_c-1}$ values of the lowest significant bit (LSB) voltage may be obtained.

In another implementation, other two inputs of the first adjustment unit 120 are from the positive pole terminal $V_{REF+}$ and the negative pole terminal $V_{REF-}$ of the reference voltage. In addition, the signal input terminal 122 of the first adjustment unit 120 may be used to input the output voltage of the conversion unit 110. The analog signal output by the conversion unit 110 may be processed by the first adjustment unit 120 with the $N_c$ bits, to output an analog voltage capable of being flexibly adjusted. The output voltage of the first adjustment unit 120 is used to drive a capacitive load, or drive, through a buffer circuit, a resistive load and a capacitive load which has a specific speed requirement.

In the digital-to-analog conversion circuit provided by the embodiment of the present disclosure, a conversion unit and a first adjustment unit are incorporated to simply and effectively adjust a voltage range. Specifically, the digital-to-analog conversion circuit may include the conversion unit and the first adjustment unit. Among them, the conversion unit may include a first code value receiving terminal used to receive a first code value, and the conversion unit is used to convert the first code value into an analog signal. The first adjustment unit may include a second code value receiving terminal used to receive a second code value, a signal input terminal of the first adjustment unit is connected to a signal output terminal of the conversion unit, and the first adjustment unit is used to obtain a first analog adjustment signal based on the second code value, and adjust, with first analog adjustment signal, the analog signal transmitted from the conversion unit, to obtain a target signal. In the present disclosure, after the conversion unit converts the received first code value into the analog signal, the analog signal may be adjusted by the first adjustment unit, which can make the finally obtained target signal accurate and effective.

Figure 2:
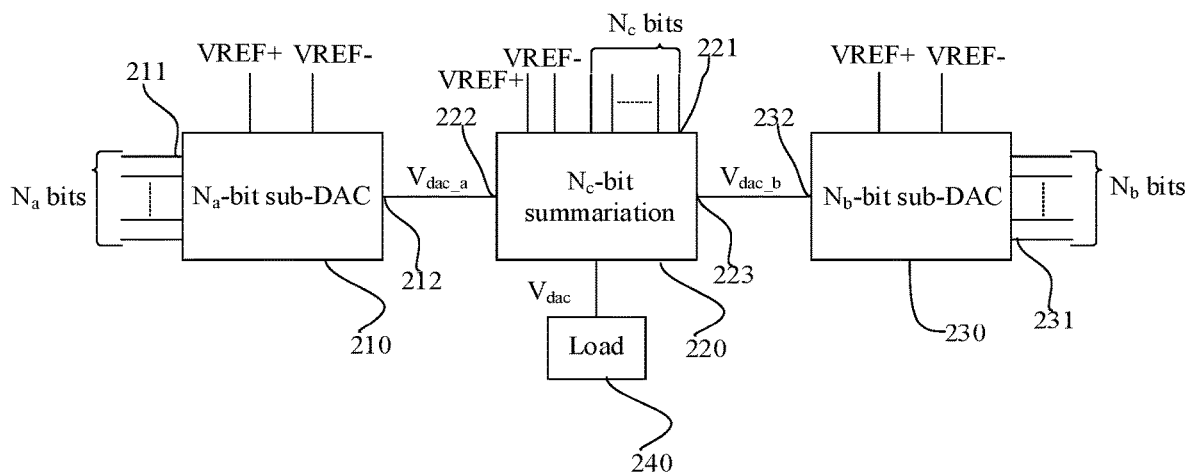
FIG. 2 is a schematic structural diagram of a digital-to-analog conversion circuit according to another embodiment of the present disclosure.

Referring to FIG. 2, which is a schematic structural diagram of a digital-to-analog conversion circuit according to another embodiment of the present disclosure. Besides the conversion unit 210 and the first adjustment unit 220, the digital-to-analog conversion circuit 200 may further include a second adjustment unit 230.

In some embodiments, the second adjustment unit 220 also includes a third code value receiving terminal 231, and the third code value receiving terminal 231 is used to receive a third code value. A signal output terminal 232 of the second adjustment unit 230 may be connected with the signal input terminal 223 of the first adjustment unit 220. The second adjustment unit 230 is used to obtain a second analog signal according to the third code value, and adjust, with the second analog signal, the analog signal transmitted by the conversion unit 210.

In an implementation, the $N_b$ bits illustrated in FIG. 2 may be referred to as the third code value, and $V_{dac\_b}$ is the converted second analog signal which may also be referred to as the output voltage signal of the second adjustment unit. The third code value may be a set of parallel coded signals generated by the digital signal system, and it may be a binary code value. For example, the first code value may be a binary code value of two bits, a binary code value of four bits, a binary code value of eight bits, or a binary code value of sixteen bits. The specific number of the bits is not explicitly limited here, and it may be chosen based on the actual situations.

In an implementation, the second adjustment unit 230 may be constituted by multiple switches and unit resistors, and the number of the switches and the number of the resistors are determined by the third code value. The third code value ranges from 0 to $2^{N_b}-1$ and $2^{N_b}$ analog output voltages may be obtained, where $N_b$ may be the number of the binary bits. In addition, as can be seen from FIG. 2, besides the third code value receiving terminal 231, the second adjustment unit may further include a signal output terminal 232, as well as a positive pole terminal and a negative pole terminal of a reference voltage. The positive pole terminal of the reference voltage is $V_{REF+}$ illustrated in FIG. 2, and the negative pole terminal of the reference voltage is $V_{REF-}$ illustrated in FIG. 2.

In some embodiments, the third code value generated by the digital signal system may be constituted by $m_b$ "0" and $n_b$ "1", where $m_b+n_b=N_b$. When there is a "0" in the third code value, a corresponding internal switch of the second adjustment unit 230 is connected to the negative pole terminal of the reference voltage $V_{REF-}$; and when there is a "1" in the third code value, a corresponding internal switch of the second adjustment unit 230 is connected to the positive pole terminal of the reference voltage $V_{REF+}$. In the embodiment of the present disclosure, through the series and parallel resistors, a second analog voltage signal, which is in a certain proportion to $(V_{REF+})-(V_{REF-})$, may be obtained through the second adjustment unit 230.

In an implementation, when $m_b=N_b$ and $n_b=0$, the output of the second adjustment unit 230 is minimum, and all the bits of the third code value in this case are 0. For example, when $m_b=3$ and $n_b=0$, the corresponding third code value is 000. In addition, when $m_b=0$ and $n_b=N_b$, the output of the second adjustment unit 230 is maximum, and all the bits of the third code value in this case are 1. For example, when $m_b=0$ and $n_b=3$, the corresponding third code value is 111. The lowest significant bit (LSB) of the second adjustment unit 230 is the lowest bit of the $N_b$ bits, and the minimum variation in output corresponding to the lowest bit is $$1LSB = \frac{V_{REF+} + V_{REF-}}{2^{N_b}}.$$

The maximum analog output voltage is a full-scale voltage $$V_{FS\_b} = \frac{2^{N_b} - 1}{2^{N_b}}(V_{REF+} + V_{REF-}).$$

In the embodiment of the present disclosure, the first adjustment unit 220 may be constituted by multiple switches and unit resistors. The first adjustment unit 220 may be referred to as a summation circuit. A first input of the first adjustment unit 220 is the binary code value of the $N_c$ bits, and the binary code value of the $N_c$ bits is the second code value. The highest bit of the second code value (the code value of $N_c$ bits) is used to select the output range of the conversion unit 110, and the remaining $(N_c-1)$ bits are used to adjust the value of the LSB voltage of the conversion unit 210. $2^{N_c-1}$ values of the lowest significant bit (LSB) voltage may be obtained, by adjusting the $(N_c-1)$ bits.

In another implementation, a second input and a third input of the first adjustment unit 220 are from the positive pole terminal $V_{REF+}$ and the negative pole terminal $V_{REF-}$ of the reference voltage, a fourth input of the first adjustment unit 220 is the output voltage of the conversion unit 210, and a fifth input of the first adjustment unit 220 is the output voltage of the second adjustment unit 230. After the analog signal output by the conversion unit 210 and the analog signal output by the second adjustment unit 230 are processed by the first adjustment unit 220, an analog voltage capable of being flexibly adjusted is output. The output voltage of the first adjustment unit 220 is used to drive a capacitive load, or drive, through a buffer circuit, a resistive load and a capacitive load which has a specific speed requirement.

Figure 3:
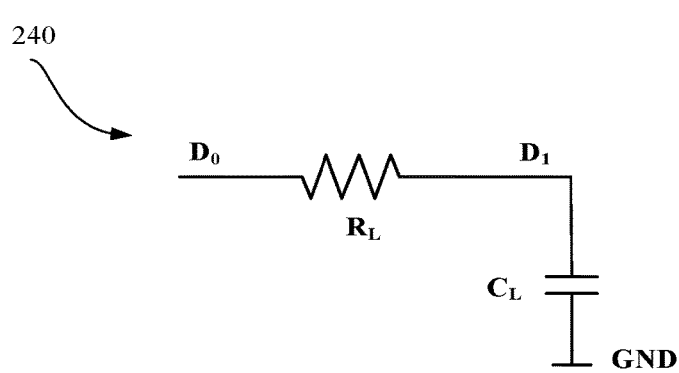
FIG. 3 is a schematic structural diagram of a load in the digital-to-analog conversion circuit according to another embodiment of the present disclosure.

In some other embodiments, the digital-to-analog conversion circuit 200 may include a load 240. The load 240 is connected to the first adjustment unit 220, and receives the target signal ($V_{dac}$) transmitted from the first adjustment unit 220. In other words, the target signal obtained from the first adjustment unit 220 is mainly used to power the load 240. Referring to FIG. 3, the load 240 may include a resistor $R_L$ and a capacitor $C_L$. A first connection terminal of the resistor $R_L$ is connected to the first adjustment unit 220 through a node $D_0$. A second connection terminal of the resistor $R_L$ is connected to a node $D_1$, and the node $D_1$ is connected to a first connection terminal of the capacitor $C_L$. A second connection terminal of the capacitor $C_L$ is grounded (GND). The load 240 may be determined by a subordinate circuit. When a large capacitive or resistive load needs to be driven, in the embodiment of the present disclosure, a buffer circuit may be inserted in the load 240.

It is notable that, the conversion unit 210 in the digital-to-analog conversion circuit 200 may serve as a main circuit for output, the second adjustment unit 230 may serve as a slave circuit for output, and the first adjustment unit 220 serves as a control and adjustment circuit. When the conversion unit 210 outputs the analog voltage with a specific range, in the embodiment of the present disclosure, the second adjustment unit 230 may be controlled to adjust a common mode voltage output by the conversion unit 210, where the common mode voltage may be applied with $(2^{N_b}-1)$ adjustments. The first adjustment unit 210 may simultaneously adjust the minimum variation in the LSB of the conversion unit 210 and the second adjustment unit 230. In another implementation, in the embodiments of the present disclosure, the conversion unit 210 may be adjusted to serve as the slave circuit for output, the second adjustment unit 230 serves as the main circuit for output, and the control role of the first adjustment unit 220 is unchanged.

To sum up, the conversion unit 210 is used to convert the first code value (the binary code value of $N_a$ bits) into an analog voltage in a specific proportion to a voltage defined by the positive and negative reference voltages. The second adjustment unit 230 is used to convert the third code value (the binary code value of $N_b$ bits) into a second analog voltage in a specific proportion to a voltage defined by the positive and negative reference voltages. The first adjustment unit 220 sums up the analog output of the conversion unit 210 and the analog output of the second adjustment unit 230, to obtain the final analog output voltage, i.e., the target signal. The load 240 is the output driving stage of the overall analog voltage, and the load 240 usually is a capacitive load.

As can be seen from the above introduction, the conversion unit 210 may include the switches and the unit resistors, and the input of the conversion unit 210 includes the first code value (a code value signal of $N_a$ bits) generated by the digital signal system, and those from the positive pole terminal $V_{REF+}$ and the negative pole terminal $V_{REF-}$ of the reference voltage. The "1" or "0" in the first code value (the code value signal of $N_a$ bits) enables the corresponding switch to be controlled to be turned on or off, and makes it connected to $V_{REF+}$ or the $V_{REF-}$. After the voltage division by the internal resistors, an analog signal $V_{dac\_a}$ in one-to-one correspondence to the code value is finally obtained.

Figure 4:
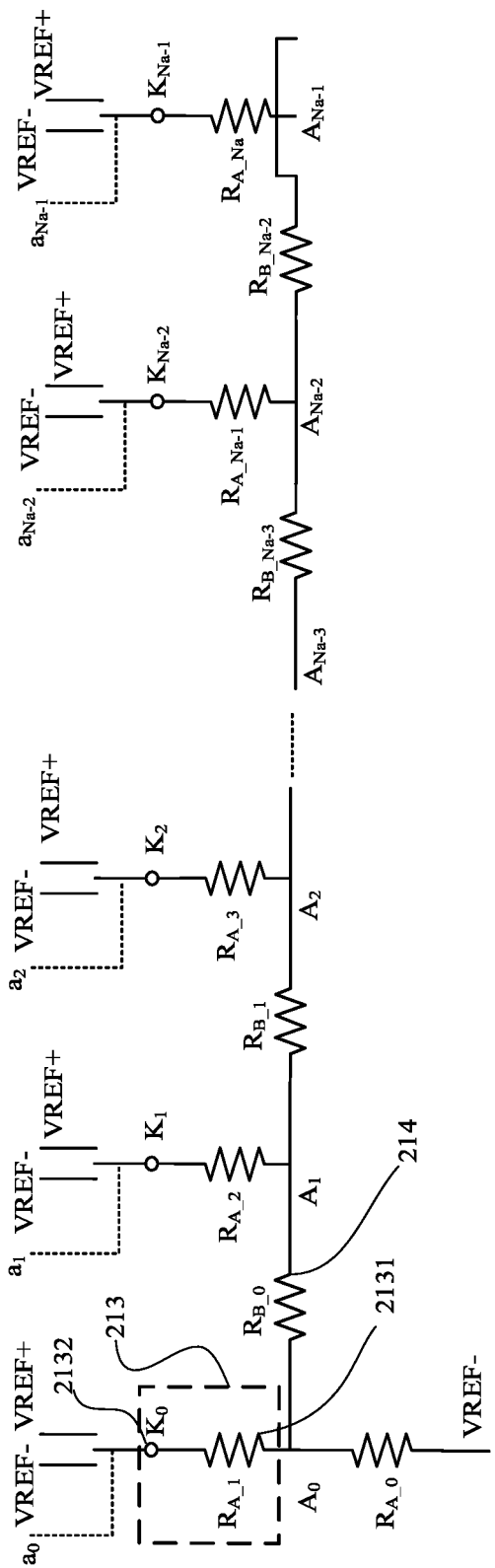
FIG. 4 is a schematic structural diagram of a conversion unit in the digital-to-analog conversion circuit according to another embodiment of the present disclosure.

Referring to FIG. 4, the conversion unit may include m second resistor-selection sub-units 213, and a third resistor 214 is provided between every two adjacent second resistor-selection sub-units 213. The third resistor 214 is connected to its adjacent second resistor-selection sub-units 213. In addition, each second resistor-selection sub-unit includes a fourth resistor 2131, and a second switch element 2132. A control terminal of the second switch element 2132 is used to receive the first code value, a second connection terminal of the second switch element 2132 is connected to a first connection terminal of the fourth resistor 2131, and a second connection terminal of the fourth resistor 2131 is connected to the third resistor 214.

In addition, as can be seen from FIG. 4, the conversion unit 210 may include single-pole double-throw switches $K_0$, $K_1, \ldots, K_{Na-2}$, and $K_{Na-1}$, resistors $R_{A\_0}, R_{A\_1}, \ldots, R_{A\_Na-1}$ and $R_{A\_Na}$, and resistors $R_{B\_0}, R_{B\_1}, \ldots, R_{B\_Na-1}$ and $R_{B\_Na-2}$. Among others, $R_{A\_i}=2R$ (i=0, 1, ..., $N_{a-1}$, Na), $R_{B\_i}=R$ (i=0, 1, ..., $N_{a-3}$, $N_{a-2}$), and the R is unit resistance. The $N_a$ bits of the binary code $a_{Na-1}a_{Na-2} \ldots a_2a_1a_0$ control selection of the corresponding switches, respectively. When one bit of $a_{Na-1}a_{Na-2} \ldots a_2a_1a_0$ is "0", its corresponding switch of $K_0, K_1, \ldots, K_{Na-2}$ and $K_{Na-1}$ is connected to $V_{REF-}$. When one bit of $a_{Na-1}a_{Na-2} \ldots a_2a_1a_0$ is "1", its corresponding switch of $K_0, K_1, \ldots, K_{Na-2}$ and $K_{Na-1}$ is connected to $V_{REF+}$. Switch $k_0$ is a three-terminal device controlled by $a_0$ in the $N_a$ code value, with the first terminal of switch $k_0$ connected to $V_{REF-}$, the second terminal connected to $V_{REF+}$, and the third terminal connected to the first terminal of resistor $R_{A\_1}$. The second terminal of resistor $R_{A\_1}$ is connected to node $A_0$, and node $A_0$ is in turn connected to each of the first terminal of resistor $R_{A\_0}$ and the first terminal of resistor $R_{B\_0}$. The second terminal of resistor $R_{A\_0}$ is connected to $V_{REF-}$. The second terminal of resistor $R_{B\_0}$ is connected to node $A_1$. Further, node $A_1$ is connected to the first terminal of resistor $R_{A\_2}$ and the first terminal of resistor $R_{B\_1}$. The second terminal of resistor $R_{A\_2}$ is connected to the third terminal of switch $K_1$. Switch $K_1$ is controlled by bit $a_1$ of the code value of $N_a$ bits. The first terminal of switch $K_1$ is connected to $V_{REF-}$, and the second terminal of switch $K_1$ is connected to $V_{REF+}$. The second terminal of resistor $R_{B\_1}$ is connected to node $A_2$. Further, node $A_2$ is connected to each of the first terminal of resistor $R_{A\_3}$ and the first terminal of resistor $R_{B\_1}$. The second terminal of resistor $R_{A\_3}$ is connected to the third terminal of switch $K_2$. Switch $K_2$ is controlled by the bit $a_2$ of the code value of $N_a$ bits. The first terminal of switch $K_2$ is connected to $V_{REF-}$, and the second terminal of switch $K_2$ is connected to $V_{REF+}$. The second terminal of resistor $R_{B\_2}$ is connected to node $A_3$. The subsequent connections follow the previous pattern of connection. The second terminal of resistor $R_{B\_Na-3}$ is connected to node $A_{Na-2}$. Further, node $A_{Na-2}$ is connected to each of the first terminal of resistor $R_{A\_Na-1}$ and the first terminal of resistor $R_{B\_Na-2}$. The second terminal of resistor $R_{A\_Na-1}$ is connected to the third terminal of switch $K_{Na-2}$. Switch $K_{Na-2}$ is controlled by the bit $a_{Na-2}$ of the code value of $N_a$ bits. The first terminal of switch $K_{Na-2}$ is connected to $V_{REF-}$, and the second terminal of switch $K_{Na-2}$ is connected to $V_{REF+}$. The second terminal of resistor $R_{B\_Na-2}$ is connected to node $A_{Na-1}$. Further, node $A_{Na-1}$ is connected to each of resistor $R_{A\_Na}$ and the first terminal of the summation circuit of next stage. Among them, the binary code of $N_a$ bits is the first code value, and the $N_{a-1}$ is m.

Figure 5:
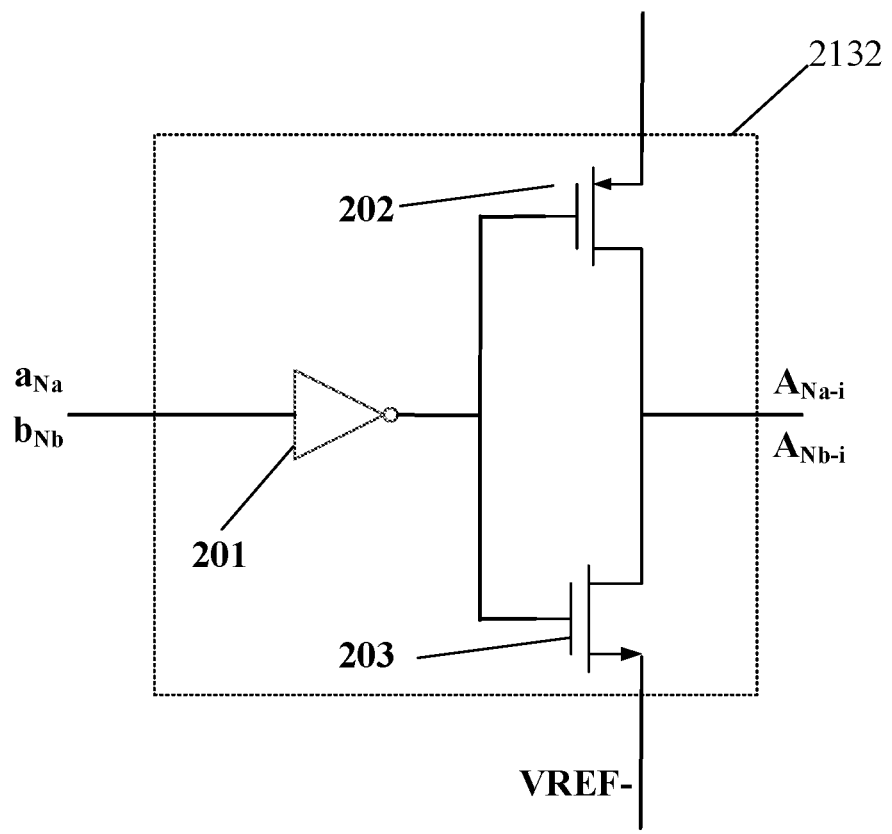
FIG. 5 is a schematic structural diagram of a second switch element in the digital-to-analog conversion circuit according to another embodiment of the present disclosure.

Referring to FIG. 5, the second switch element 2132 may include a second inverter 201, a second PMOS transistor 202, and a second NMOS transistor 203. The input terminal of the second inverter 201 is used to receive the first code value, and the output terminal of the second inverter 201 is connected to each of the gate of the second PMOS transistor 202 and the gate of the second NMOS transistor 203. The source of the second PMOS transistor 202 is connected to the positive pole terminal of the reference voltage, the drain of the second PMOS transistor 202 is connected to the drain of the second NMOS transistor 203, and the source of the second NMOS transistor 203 may be connected to the negative pole terminal of the reference voltage.

In a specific implementation, the second switch element 2132 is a switch with four ports, where the drain of the second PMOS transistor 202 and the drain of the second NMOS transistor 203 are connected and they are connected to node $A_i$ (i=0, 1, ..., $N_{a-1}$) in FIG. 4. The source of the second NMOS transistor 203 is connected to $V_{REF-}$. The input of the inverter 201 is connected to $a_{Na}$ in the code value of $N_a$ bits.

In some other implementations, the second adjustment unit 230 may also include switches and unit resistors, and the input of the second adjustment unit 230 includes the third code value (a code value control signal of $N_b$ bits) from the digital signal system, the positive reference voltage $V_{REF+}$ and the negative reference voltage $V_{REF-}$. The "1" or "0" in the code value of $N_b$ bits enables the corresponding switch to be turned on or off, and makes it connected to $V_{REF+}$ or $V_{REF-}$. After the voltage division by the internal resistors, an analog signal $V_{dac\_b}$ in one-to-one correspondence to the code value is finally obtained.

Figure 6:
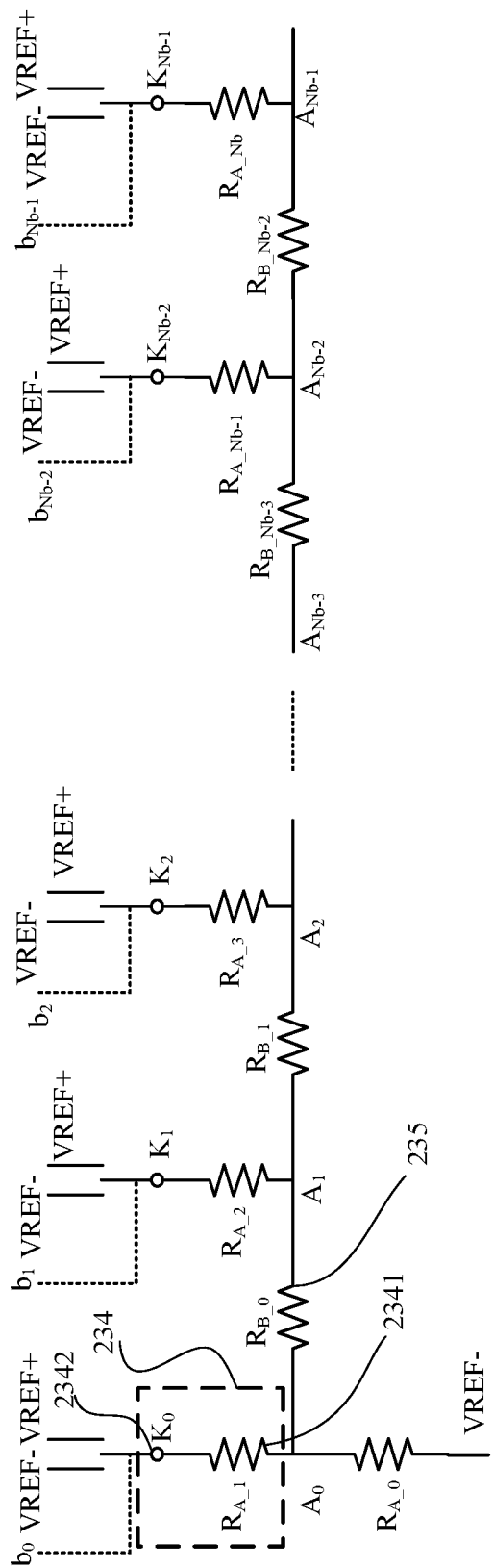
FIG. 6 is a schematic structural diagram of a second adjustment unit in the digital-to-analog conversion circuit according to another embodiment of the present disclosure.

Referring to FIG. 6, the second adjustment unit 230 may include n first resistor-selection sub-units 234, and a first resistor 235 is provided between every two adjacent first resistor-selection sub-units 234. The first resistor 235 is electrically connected to its adjacent first resistor-selection sub-units 234. In addition, each first resistor-selection sub-unit 234 includes a second resistor 2341, and a first switch element 2342. A control terminal of the first switch element 2342 is used to receive the third code value, a second connection terminal of the first switch element 2342 is connected to a first connection terminal of the second resistor 2341, and a second connection terminal of the second resistor 2341 is connected to the first resistor 235.

In addition, as can be seen from FIG. 6, the second adjustment unit 230 may include single-pole double-throw switches of $K_0, K_1, \ldots, K_{Nb-2}$ and $K_{Nb-1}$, resistors $R_{A\_0}, R_{A\_1}, \ldots, R_{A\_Nb-1}$ and $R_{A\_Nb}$, and resistors $R_{B\_0}, R_{B\_1}, \ldots, R_{B\_Nb-3}$ and $R_{B\_Nb-2}$. Among them, $R_{A\_i}=2R$ (i=0, 1, ..., $N_{b-1}$, $N_b$), $R_{B\_i}=R$ (i=0, 1, ..., $N_{b-3}$, $N_{b-2}$), and R is unit resistance. The $N_b$ bits of the binary code $b_{Nb-1}b_{Nb-2} \ldots b_2b_1b_0$ control selection of the corresponding switches, respectively. When one bit of $b_{Nb-1}b_{Nb-2} \ldots b_2b_1b_0$ is "0", its corresponding switch of $K_0, K_1, \ldots, K_{Nb-2}$ and $K_{Nb-1}$ is connected to $V_{REF-}$. When one bit of $b_{Nb-1}b_{Nb-2} \ldots b_2b_1b_0$ is "1", its corresponding switch of $K_0, K_1, \ldots, K_{Nb-2}$ and $K_{Nb-1}$ is connected to $V_{REF+}$. Switch $K_0$ is a three-terminal device controlled by $b_0$ in the $N_b$ code value, with the first terminal of switch $K_0$ connected to $V_{REF-}$, the second terminal connected to $V_{REF+}$, and the third terminal connected to the first terminal of resistor $R_{A\_1}$. The second terminal of resistor $R_{A\_1}$ is connected to node $A_0$, and node $A_0$ is in turn connected to each of the first terminal of resistor $R_{A\_0}$ and the first terminal of resistor $R_{B\_0}$. The second terminal of resistor $R_{A\_0}$ is connected to $V_{REF-}$. The second terminal of resistor $R_{B\_0}$ is connected to node $A_1$. Further, node $A_1$ is connected to each of the first terminal of resistor $R_{A\_2}$ and the first terminal of resistor $R_{B\_1}$. The second terminal of resistor $R_{A\_2}$ is connected to the third terminal of switch $K_1$. Switch $K_1$ is controlled by the bit $b_1$ of the code value of $N_b$ bits. The first terminal of switch $K_1$ is connected to $V_{REF+}$, and the second terminal of switch $K_1$ is connected to $V_{REF+}$. The second terminal of resistor $R_{B\_1}$ is connected to node $A_2$. Further, node $A_2$ is connected to each of the first terminal of resistor $R_{A\_3}$ and the first terminal of resistor $R_{B\_2}$. The second terminal of resistor $R_{A\_3}$ is connected to the third terminal of switch $K_2$. Switch $K_2$ is controlled by the bit $b_2$ of the code value of $N_b$ bits. The first terminal of switch $K_2$ is connected to $V_{REF-}$, and the second terminal of switch $K_2$ is connected to $V_{REF+}$. The second terminal of resistor $R_{B\_2}$ is connected to node $A_3$. The subsequent connections follow the previous pattern of connection. The second terminal of resistor $R_{B\_Nb-3}$ is connected to node $A_{Nb-2}$. Further, node $A_{Nb-2}$ is connected to each of the first terminal of resistor $R_{A\_Nb-1}$ and the first terminal of resistor $R_{B\_Nb-2}$. The second terminal of resistor $R_{A\_Nb-1}$ is connected to the third terminal of switch $K_{Nb-2}$. Switch $K_{Nb-2}$ is controlled by the bit $b_{Nb-2}$ of the code value of $N_b$ bits. The first terminal of switch $K_{Nb-2}$ is connected to $V_{REF-}$, and the second terminal thereof is connected to $V_{REF+}$. The second terminal of resistor $R_{B\_Nb-2}$ is connected to node $A_{Nb-1}$. Further, node $A_{Nb-1}$ is connected to each of resistor $R_{A\_Nb}$ and the second terminal of the summation circuit of next stage. Among them, the binary code of $N_b$ bits is the third code value, and the $N_{b-1}$ is n.

Figure 7:
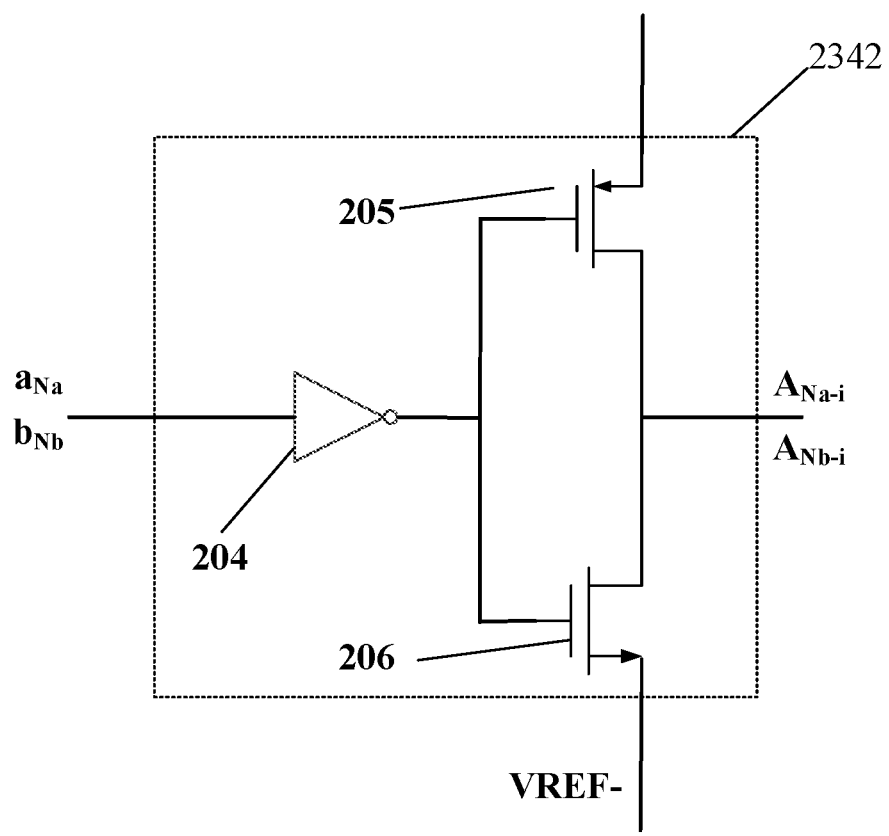
FIG. 7 is a schematic structural diagram of a first switch element in the digital-to-analog conversion circuit according to another embodiment of the present disclosure.

Referring to FIG. 7, the first switch element 2342 may include a first inverter 204, a first PMOS transistor 205, and a first NMOS transistor 206. The input terminal of the first inverter 204 is used to receive the third code value, and the output terminal of the first inverter 204 is connected to each of the gate of the first PMOS transistor 205 and the gate of the first NMOS transistor 206. The source of the first PMOS transistor 205 is connected to the positive pole terminal of the reference voltage, the drain of the first PMOS transistor 205 is connected to the drain of the first NMOS transistor 206, and the source of the first NMOS transistor 206 may be connected to the negative pole terminal of the reference voltage.

In a specific implementation, the first switch element 2342 may be a switch with four ports, where the drain of the first NMOS transistor 206 and the drain of the first PMOS transistor 205 are connected and they are connected to node $A_i$ (i=0, ... $N_{b-1}$) in FIG. 6. The source of the first PMOS transistor 205 is connected to $V_{REF-}$. The input of the inverter 204 is connected to $b_{Nb}$ in the code value of $N_b$ bits.

In some other implementations, the first adjustment unit 220 may be constituted by switches and resistors, and the input of the first adjustment unit 220 includes the second code value (a code value control signal of $N_c$ bits) of the digital signal system, the positive reference voltage $V_{REF+}$, the negative reference voltage $V_{REF-}$, as well as an analog output voltage of $N_a$ bits and an analog output voltage of $N_b$ bits. The "1" or "0" in the code value of $N_c$ bits enables its corresponding switch to be turned on or off, and makes it connected to the respective $V_{REF+}$ or $V_{REF-}$. After the first adjustment unit 220 performs a summarizing operation on the two analog voltages, a final target signal $V_{dac}$ is output, and the target signal may be an analog voltage.

Figure 8:
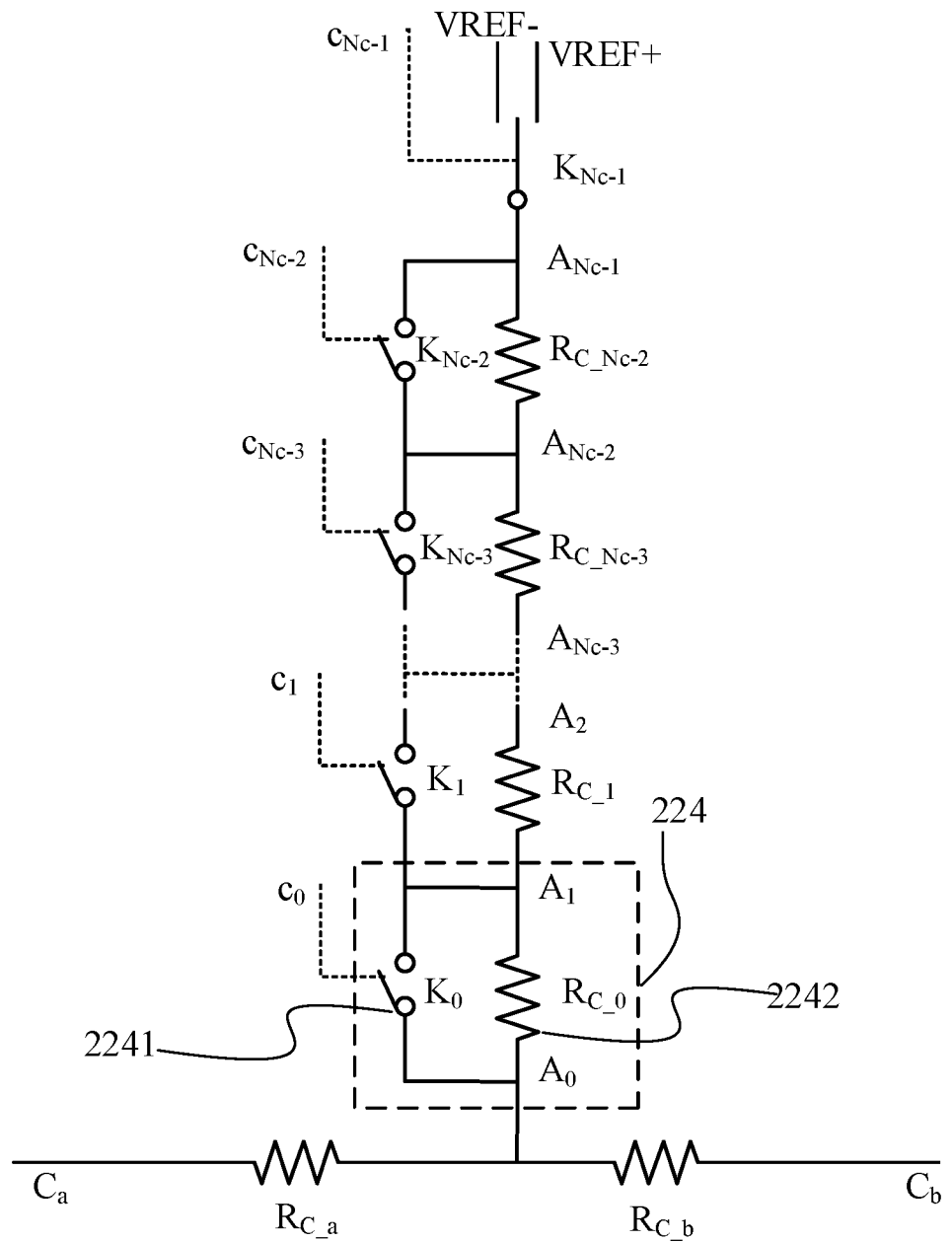
FIG. 8 is a schematic structural diagram of a first adjustment unit in the digital-to-analog conversion circuit according to another embodiment of the present disclosure.

Referring to FIG. 8, the first adjustment unit 220 may include k third resistor-selection sub-units 224. Each third resistor-selection sub-unit may include a third switch element 2241 and a fifth resistor 2242, and the third switch element 2241 is connected parallel to the fifth resistor 2242. As can be seen from FIG. 8, the first adjustment unit 220 may include single-pole single-throw switches $K_0$, $K_1$, ..., and $K_{Nc-2}$, a single-pole single-throw switch $K_{Nc-1}$, resistors $R_{C\_0}$, $R_{C\_1}$, ..., $R_{C\_Nc-3}$ and $R_{C\_Nc-2}$, and resistors $R_{C\_a}$ and $R_{C\_b}$. Among them, $R_{C\_a}=R_{C\_b}=R$, $R_{C\_i}=2^iR$ (i=0, 1, $N_{c-3}$, $N_{c-2}$), and R is unit resistance. The $N_c$ bits of the binary code $C_{Nc-1}C_{Nc-2}...C_2C_1C_0$ control their corresponding switches, respectively. When one bit of $C_{N-c-2}$ ... $C_2C_1C_0$ is "0", its corresponding switch of $K_0$, $K_1$, ..., $K_{N-c-2}$ is turned off. When one bit of $C_{N-c-2}$ ... $C_2C_1C_0$ is "1", its corresponding switch of $K_0$, $K_1$, ..., $K_{Nc-2}$ is turned on, and the resistor connected in parallel to the switch is short circuited. When the bit $C_{Nc-1}$ is "0", switch $K_{Nc-1}$ is connected to $V_{REF-}$. When the bit $C_{Nc-1}$ is "1", switch $K_{Nc-1}$ is connected to $V_{REF+}$. Node $C_a$ is connected to the first terminal of resistor $R_{C\_a}$, and the other terminal of resistor $R_{C\_a}$ is connected to node $A_0$. Further, node $A_0$ is connected to each of the first terminal of switch $K_0$, the first terminal of resistor $R_{C\_0}$, and the first terminal of resistor $R_C$ b. $K_0$ is controlled by the bit $C_0$ of the code value of $N_c$ bits. The second terminal of resistor $R_{C\_b}$ is connected to node $C_b$. The second terminal of resistor $R_{C\_0}$ is connected to node $A_1$. Further, node $A_1$ is connected to each of the second terminal of switch $K_0$, the first terminal of switch $K_1$, and the first terminal of resistor $R_{C\_1}$. $K_1$ is controlled by the bit $C_1$ of the code value of $N_c$ bits. The second terminal of resistor $R_{C\_1}$ is connected to node $A_2$. The subsequent connections follow the previous pattern of connection. Node $A_{Nc-3}$ is connected to each of the second terminal of switch $K_{Nc-4}$, the first terminal of switch $K_{Nc-3}$, and the first terminal of resistor $R_{C\_Nc-3}$. $K_{Nc-3}$ is controlled by the bit $C_{Nc-3}$ of the code value of $N_c$ bits. The second terminal of resistor $R_{C\_Nc-3}$ is connected to node $A_{Nc-2}$. Further, node $A_{Nc-2}$ is connected to each of the second terminal of switch $K_{Nc-3}$, the first terminal of switch $K_{N-c-2}$, and the first terminal of resistor $R_{C\_Nc-2}$. $K_{Nc-2}$ is controlled by the bit $C_{N-c-2}$ of the code value of $N_c$ bits. The second terminal of resistor $R_{C\_Nc-2}$ is connected to node $A_{Nc-1}$. Further, node $A_{Nc-1}$ is connected to each of the second terminal of the switch $K_{N-c-2}$ and the first terminal of switch $K_{Nc-1}$. The second terminal and the third terminal of switch $K_{Nc-1}$ are connected to $V_{REF-}$ and $V_{REF+}$, respectively. Among them, the binary code of $N_c$ bits is the second code value, and the $N_c-1$ is k.

Figures 9, 10:
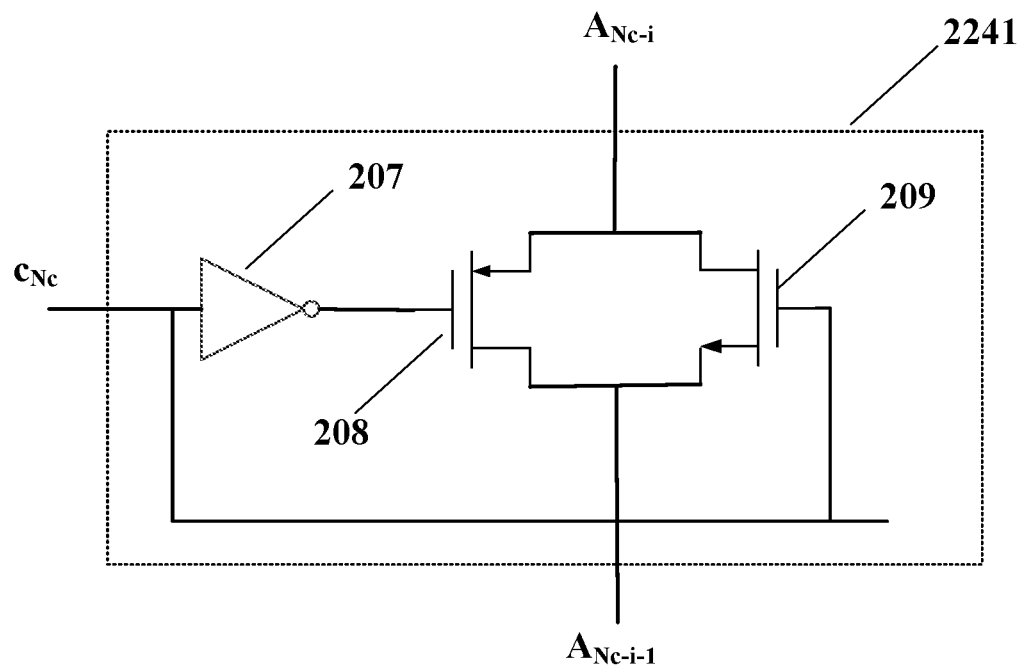
FIG. 9 is a schematic structural diagram of a third switch element in the digital-to-analog conversion circuit according to another embodiment of the present disclosure.
FIG. 10 is a method flowchart of a digital-to-analog conversion method according to an embodiment of the present disclosure.

Referring to FIG. 9, the third switch element 2241 may include a third inverter 207, a third PMOS transistor 208, and a third NMOS transistor 209. The input of the third inverter 207 is used to receive the second code value, and the output of the third inverter 207 is connected to the gate of the third PMOS transistor 208. The source of the third PMOS transistor 208 is connected to the drain of the third NMOS transistor 209, and the drain of the third PMOS transistor 208 is connected to the source of the third NMOS transistor 209.

As can be seen from FIG. 9, the input of the inverter 207 is connected to each of ci (i=0, 1, ..., $N_{c-2}$) in the $N_c$ code value and the gate of the NMOS transistor 209 simultaneously. The output of the inverter 207 is connected to the gate of the PMOS transistor 208. The source of the PMOS transistor 208 is connected to the drain of the NMOS transistor 209 and connected to node $A_i$ (i=0, 1, ..., $N_{c-1}$) in FIG. 8. The drain of the PMOS transistor 208 is connected to the source of the NMOS transistor 209 and connected to the node $A_{i-1}$ (i=0, 1, ..., $N_{c-1}$) in FIG. 8.

In the embodiment of the present disclosure, the output $V_{dac\_b}$ of the second adjustment unit 230 may be increased or decreased by changing the third code value, and the change is processed by the first adjustment unit 220, to make $V_{dac\_a}$ perform the same increase or decrease based on $V_{dac\_b}$. By changing the second code value, in the embodiment of the present disclosure, the minimum variation of $V_{dac\_a}$ and the minimum variation of $V_{dac\_b}$ may be changed simultaneously. In this way, the final output may be obtained, i.e., $V_{dac\_a}+V_{dac\_b}=V_{dac}$.

In the digital-to-analog conversion circuit provided by the embodiments of the present disclosure, the conversion unit and the first adjustment unit are incorporated to simply and effectively adjust a voltage range. Specifically, the digital-to-analog conversion circuit may include the conversion unit and the first adjustment unit. The conversion unit may include the first code value receiving terminal used to receive the first code value, the conversion unit is used to convert the first code value into an analog signal. The first adjustment unit may include the second code value receiving terminal used to receive the second code value. The signal input terminal of the first adjustment unit is connected to the signal output terminal of the conversion unit. The first adjustment unit is used to obtain the first analog adjustment signal based on the second code value, and adjust, with the first analog signal, the analog signal transmitted from the conversion unit, to obtain the target signal. In the present disclosure, after the conversion unit converts the received first code value into the analog signal, the analog signal may be adjusted by the first adjustment unit, which can make the finally obtained target signal accurate and effective. In addition, in the embodiments of the present disclosure, the conversion unit may serve as the main circuit and the second adjustment unit serve as the slave circuit, or the second adjustment unit may serve as the main circuit and the first adjustment unit may serve as the slave circuit; as such, the configuration of the digital-to-analog conversion circuit is flexible. Further, since the voltage range is enabled to being adjusted, the present disclosure may be applied to a real-time voltage calibration system.

Referring to FIG. 10, a method flowchart of a digital-to-analog conversion method according to an embodiment of the present disclosure is illustrated. The digital-to-analog conversion method may include blocks S210 and S220.

At block S210, a first code value is received, and converted into an analog signal.

In the embodiments of the present disclosure, when the first adjustment unit and the second adjustment unit are absent, the output of the conversion unit may be represented by the following formula:

$$V_{dac} = \sum_{k=1}^{Na} \frac{a_{Na-k} V_{REF+} + a_{Na-k} \cdot V_{REF-}}{2^k} + \frac{V_{REF-}}{2^{Na}}.$$

Figure 11:
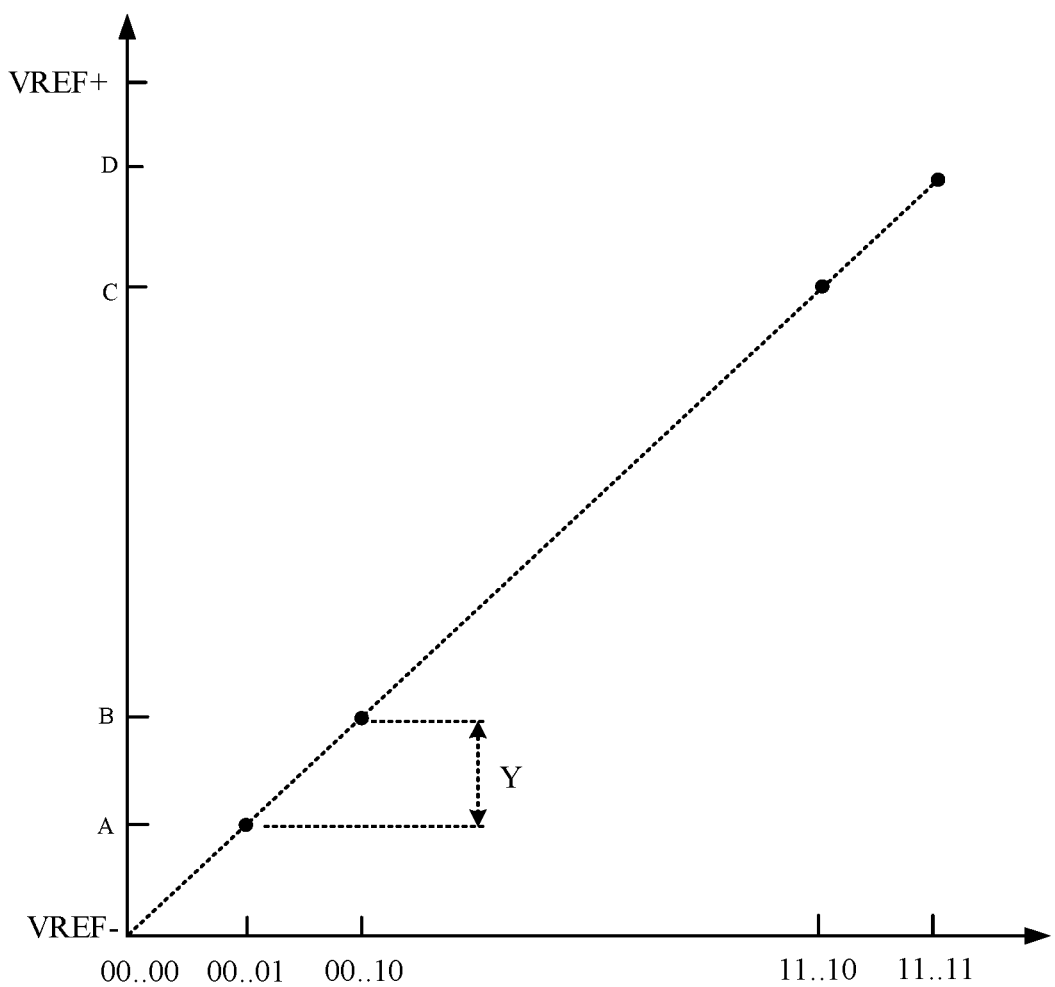
FIG. 11 is a schematic diagram illustrating a relationship between digital signals and analog signals in the digital-to-analog conversion method according to an embodiment of the present disclosure.

To better understand the correspondence between digital code values and analog code values, a diagram as illustrated in FIG. 11 is provided in the embodiment of the present disclosure. Due to the digital code, the output analog voltage cannot reach $V_{REF+}$. For the first code value (the code value of $N_a$ bits), the number of the output analog voltages is $2^{Na}-1$. The symbol "A" illustrated in FIG. 11 may be represented as $$\frac{V_{REF+} - V_{REF-}}{2^{Na}} + V_{REF-},$$

and the symbol "B" may be represented as $$2 \cdot \frac{V_{REF+} - V_{REF-}}{2^{Na}} + V_{REF-},$$

the symbol "C" may be represented as $$(2^{Na} - 2) \cdot \frac{V_{REF+} - V_{REF-}}{2^{Na}} + V_{REF-},$$

and the symbol "D" represents $$(2^{Na} - 1) \cdot \frac{V_{REF+} - V_{REF-}}{2^{Na}} + V_{REF-}.$$

Further, "Y" illustrated in FIG. 11 represents $$\frac{V_{REF+} - V_{REF-}}{2^{Na}}.$$

In addition, when the second adjustment unit and the first adjustment unit are incorporated, the target signal (the total output $V_{dac}$) may be represented by the following formula:

$$V_{dac} = \frac{R}{R_{Ctotal} + R} \cdot (c_{Nc-1} \cdot V_{REF+} + \overline{c}_{Nc-1} \cdot V_{REF-}) +$$
$$\frac{R_{Ctotal}}{R_{Ctotal} + R} \cdot \sum_{k=1}^{Na} \frac{a_{Na-k} \cdot V_{REF+} + \overline{a}_{Na-k} \cdot V_{REF-}}{2^{k+1}} + \frac{R_{Ctotal}}{R_{Ctotal} + R} \cdot \frac{V_{REF-}}{2^{Na+1}} +$$
$$\frac{R_{Ctotal}}{R_{Ctotal} + R} \cdot \sum_{k=1}^{Nb} \frac{a_{Nb-k} \cdot V_{REF+} + \overline{a}_{Nb-k} \cdot V_{REF-}}{2^{k+1}} + \frac{R_{Ctotal}}{R_{Ctotal} + R} \cdot \frac{V_{REF-}}{2^{Nb+1}}.$$

In the above formula, the first term represents two ranges, i.e., a high range and a low range, controlled by the highest bit of the second code value, where the first term is $$\frac{R}{R_{Ctotal} + R} \cdot (c_{Nc-1} \cdot VREF_+ + \overline{c}_{Nc-1} \cdot VREF_-);$$

and the second term and the third term represent the analog output voltage of the conversion unit, where the second term is $$\frac{R_{Ctotal}}{R_{Ctotal} + R} \cdot \sum_{k=1}^{Na} \frac{a_{Na-k} \cdot VREF_+ + \overline{a}_{Na-k} \cdot VREF_-}{2^{k+1}},$$

and the third term is $$\frac{R_{Ctotal}}{R_{Ctotal} + R} \cdot \frac{VREF_-}{2^{Na+1}}.$$

In addition, the fourth term and the fifth term represent the output voltage of the second adjustment unit, where the fourth term is $$\frac{R_{Ctotal}}{R_{Ctotal} + R} \cdot \sum_{k=1}^{Nb} \frac{a_{Nb-k} \cdot VREF_+ + \overline{a}_{Nb-k} \cdot VREF_-}{2^{k+1}},$$

and the fifth term is $$\frac{R_{Ctotal}}{R_{Ctotal} + R} \cdot \frac{VREF_-}{2^{Nb+1}}.$$

Corresponding, the variation of the conversion unit is $$1 LSB = \frac{1}{2^{Na+1}} \cdot \frac{R_{Ctotal}}{R_{Ctotal} + R} \cdot (VREF_+ - VREF_-),$$

and the minimum variation of the second adjustment unit is $$1 LSB = \frac{1}{2^{Nb+1}} \cdot \frac{R_{Ctotal}}{R_{Ctotal} + R} \cdot (VREF_+ - VREF_-).$$

In addition, $R_{Ctotal}$ is the total resistance of the $N_c$-bit summation circuit, which is represented as $$R_{Ctotal=}R_{Ctotal} = \sum_{k=1}^{Nc} \frac{C^{Nc-k}}{2^k} \cdot R.$$

Figure 12:
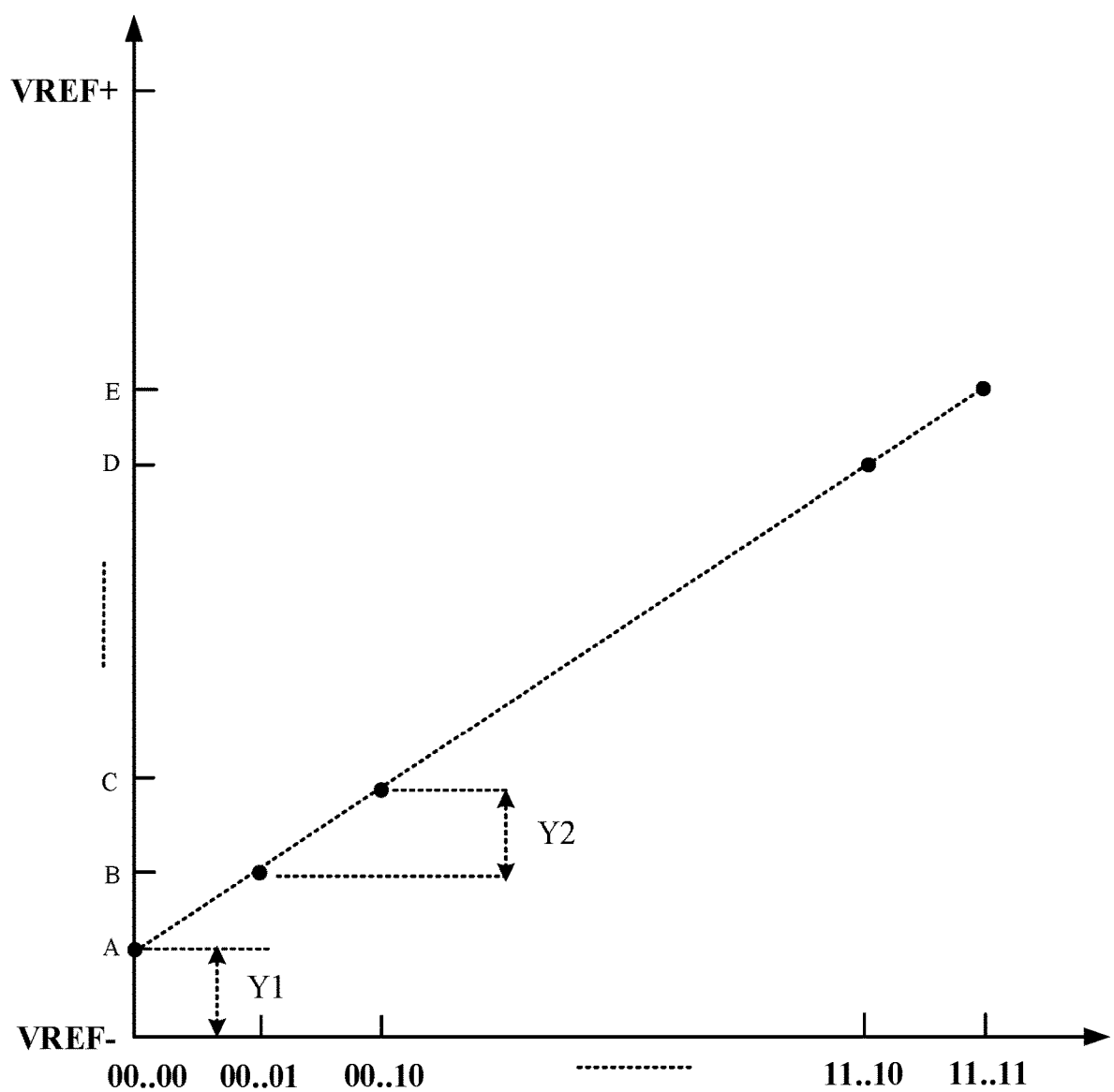
FIG. 12 is another schematic diagram illustrating the relationship between digital signals and analog signals in the digital-to-analog conversion method according to an embodiment of the present disclosure.

In some embodiments, when the highest bit $C_{Nc-1}$ of the $N_c$ bits is controlled to be "0", the correspondence between the digital codes and the analog voltages is illustrated in FIG. 12. The second adjustment unit is controlled to adjust the output common mode voltage of the conversion unit, where the magnitude of adjusting the common mode voltage and the range of the common mode voltage may be controlled by the third code value. The symbol "A" illustrated in FIG. 12 may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} + V_{REF-};$$

the symbol "B" may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} +$$

$$\frac{R_{Ctotal}}{R_{Ctotal} + R} \frac{V_{REF+} - V_{REF-}}{2^{Na+1}} + V_{REF-};$$

the symbol "C" may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} +$$

$$\frac{R_{Ctotal}}{R_{Ctotal} + R} \frac{V_{REF+} - V_{REF-}}{2^{Na+1}} + 2 \cdot \frac{R_{Ctotal}}{R_{Ctotal} + R} \frac{V_{REF+} - V_{REF-}}{2^{Na+1}} + V_{REF-};$$

the symbol "D" may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} + \frac{R_{Ctotal}}{R_{Ctotal} + R} \frac{V_{REF+} - V_{REF-}}{2^{Na+1}} +$$

$$(2^{Na} - 2) \cdot \frac{R_{Ctotal}}{R_{Ctotal} + R} \frac{V_{REF+} - V_{REF-}}{2^{Na+1}} + V_{REF-},$$

and the symbol "E" may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} + \frac{R_{Ctotal}}{R_{Ctotal} + R} \frac{V_{REF+} - V_{REF-}}{2^{Na+1}} +$$

$$(2^{Na} - 1) \cdot \frac{R_{Ctotal}}{R_{Ctotal} + R} \frac{V_{REF+} - V_{REF-}}{2^{Na+1}} + V_{REF-}.$$

Further, the symbol "Y1" illustrated in FIG. 12 may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}},$$

and the symbol "Y2" illustrated in FIG. 12 may represent $$\frac{R_{Ctotal}}{R_{Ctotal} + R} \frac{V_{REF+} - V_{REF-}}{2^{Na+1}}.$$

Figure 13:
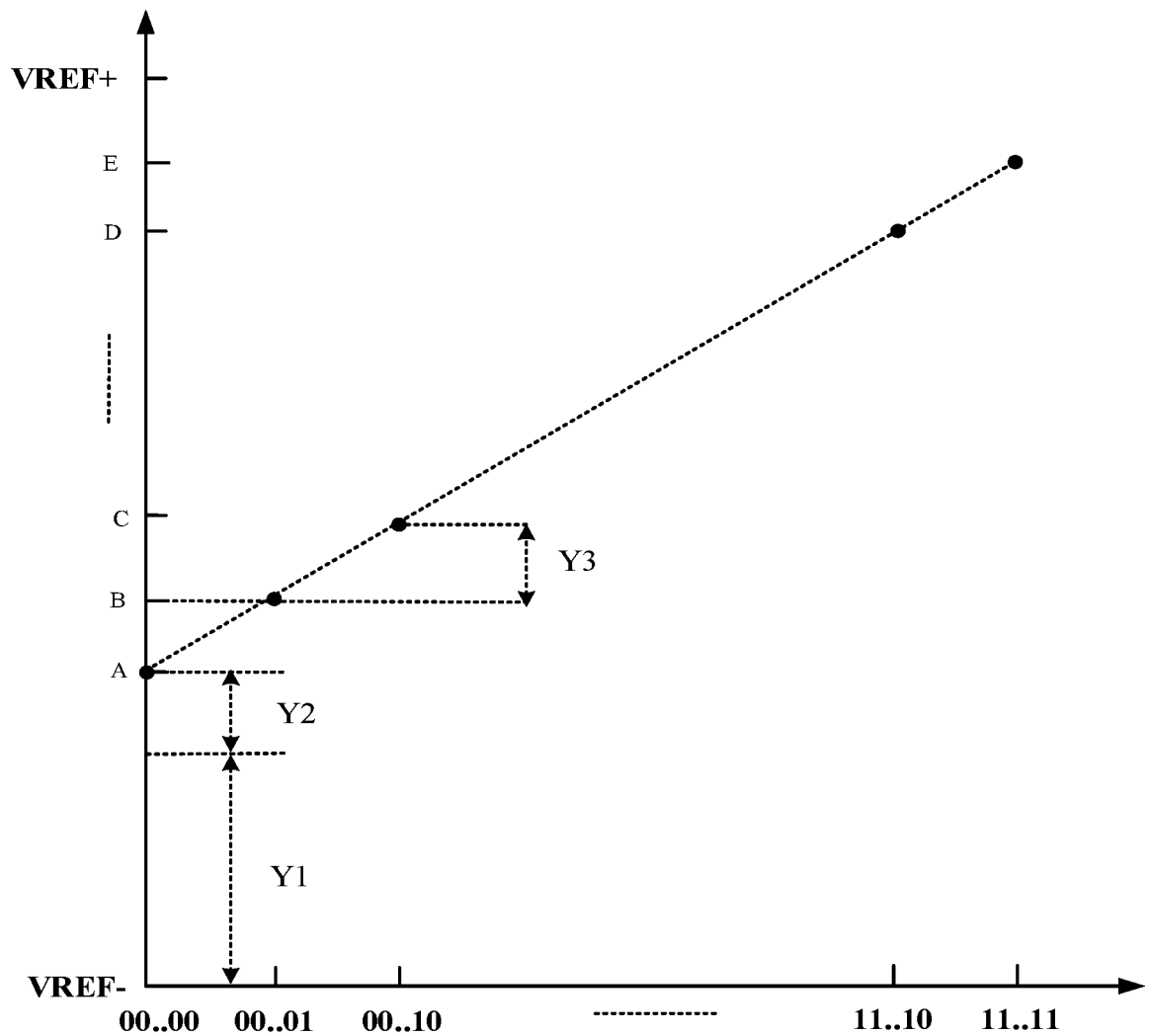
FIG. 13 is a further schematic diagram illustrating the relationship between digital signals and analog signals in the digital-to-analog conversion method according to an embodiment of the present disclosure.

In some other embodiments, when the highest bit $C_{Nc-1}$ of the second code value (the code value of $N_c$ bits) is controlled to be "1", the correspondence between the first code values (digital codes of Na bits) and the analog voltages is illustrated in FIG. 13. In this case, the corresponding initial voltage is determined by the resistors controlled by the second code value (the code value of $N_c$ bits). Similarly, the output common mode voltage of the conversion unit may be adjusted by controlling the third code value (the code value of $N_b$ bits). The symbol "A" illustrated in FIG. 13 may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} +$$

$$\frac{R_{Ctotal}}{R_{Ctotal} + R} V_{REF+} + \frac{R_{Ctotal}}{R_{Ctotal} + R} V_{REF-};$$

the symbol "B" may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} +$$

$$\frac{R_{Ctotal}}{R_{Ctotal}R +} \frac{V_{REF+} - V_{REF-}}{2^{Na+1}} + \frac{R_{Ctotal}}{R_{Ctotal} + R} V_{REF+} + \frac{R_{Ctotal}}{R_{Ctotal} + R} V_{REF-};$$

the symbol "C" may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} +$$

$$2 \cdot \frac{R_{Ctotal}}{R_{Ctotal} + R} \frac{V_{REF+} - V_{REF-}}{2^{Na+1}} + \frac{R_{Ctotal}}{R_{Ctotal} + R} V_{REF+} + \frac{R_{Ctotal}}{R_{Ctotal} + R} V_{REF-};$$

the symbol "D" may represent $$\sum_{k=1}^{Nb} 2^{Nb-k} \cdot b_{Nb-k} \cdot \frac{R_{Ctotal}}{R_{Ctotal} + R} \frac{V_{REF+} - V_{REF-}}{2^{Nb+1}} +$$

-continued $$(2^{Na}-2) \cdot \frac{R_{Ctotal}}{R_{Ctotal}+R} \frac{V_{REF+}-V_{REF-}}{2^{Na+1}} +$$

$$\frac{R_{Ctotal}}{R_{Ctotal}+R} V_{REF+} + \frac{R_{Ctotal}}{R_{Ctotal}+R} V_{REF-},$$

and the symbol "E" may represent $$\sum_{k=1}^{Nb} 2^{Nb-k} \cdot b_{Nb-k} \cdot \frac{R_{Ctotal}}{R_{Ctotal}+R} \frac{V_{REF+}-V_{REF-}}{2^{Nb+1}} +$$

$$(2^{Na}-1) \cdot \frac{R_{Ctotal}}{R_{Ctotal}+R} \frac{V_{REF+}-V_{REF-}}{2^{Na+1}} +$$

$$\frac{R_{Ctotal}}{R_{Ctotal}+R} V_{REF+} + \frac{R_{Ctotal}}{R_{Ctotal}+R} V_{REF-}.$$

Further, the symbol "Y1" illustrated in FIG. 13 may represent $$\frac{R_{Ctotal}}{R_{Ctotal}+R} V_{REF+} + \frac{R_{Ctotal}}{R_{Ctotal}+R} V_{REF-},$$

the symbol "Y2" illustrated in FIG. 13 may represent $$\sum_{k=1}^{Nb} 2^{Nb-k} \cdot b_{Nb-k} \cdot \frac{R_{Ctotal}}{R_{Ctotal}+R} \frac{V_{REF+}-V_{REF-}}{2^{Nb+1}},$$

and the symbol "Y3" illustrated in FIG. 13 may represent $$\frac{R_{Ctotal}}{R_{Ctotal}+R} \frac{V_{REF+}-V_{REF-}}{2^{Na+1}}.$$

At block S220, the analog signal is adjusted to obtain the target signal.

In some embodiments, the adjusting the analog signal to obtain the target signal may include: acquiring a digital-to-analog adjustment list, and obtaining, based on the digital-to-analog adjustment list, the target signal corresponding to the analog signal. The digital-to-analog adjustment list is obtained by acquiring multiple full-code-value digital signals, and adjusting analog signals corresponding to the multiple full-code-value digital signals.

As can be seen from the above introduction, in the embodiments of the present disclosure, in obtaining the target signal corresponding to the digital signal, a digital-to-analog adjustment list may be first created, and then the target signal corresponding to the analog signal is searched based on the digital-to-analog adjustment list. The digital-to-analog adjustment list may be obtained by acquiring multiple full-code-value digital signals and adjusting the analog signals corresponding to the multiple full-code-value digital signals. For example, as for the first code value, when $N_a$=000, VOUT=0V; when $N_a$=001, VOUT=0.1V; when $N_a$=010, VOUT=0.2V; and when $N_a$=011, VOUT=0.3V; through adjustment of the third code value $N_b$, when $N_a$=000, VOUT=0.2V; when $N_a$=001, VOUT=0.3V; when $N_a$=010, VOUT=0.4V; and when $N_a$=011, VOUT=0.5V; on this basis, through adjustment of the second code value $N_c$, when $N_a$=000, VOUT=0.2V; when $N_a$=001, VOUT=0.25V; when $N_a$=010, VOUT=0.3V; and when $N_a$=011, VOUT=0.35V. These data may be used to define the digital-to-analog adjustment list.

In the digital-to-analog conversion circuit and method provided by the embodiments of the disclosure, the conversion unit and the first adjustment unit are incorporated in the digital-to-analog conversion circuit to simply and effectively adjust the voltage range. Specifically, the digital-to-analog conversion circuit may include the conversion unit and the first adjustment unit. The conversion unit may include the first code value receiving terminal used to receive the first code value, and the conversion unit is used to convert the first code value into an analog signal. The first adjustment unit may include the second code value receiving terminal used to receive the second code value, and the signal input terminal of the first adjustment unit is connected to the signal output terminal of the conversion unit. The first adjustment unit is used to obtain a first analog adjustment signal based on the second code value, and adjust, with the first analog adjustment signal, the analog signal transmitted from the conversion unit, to obtain the target signal. In the present disclosure, after the conversion unit converts the received first code value into the analog signal, the analog signal may be adjusted by the first adjustment unit, which can make the finally obtained target signal accurate and effective.

As can be seen, it is understandable for those skilled in the art that, all or some steps in the disclosed method, the system disclosed above, and functional modules/units in the system may be implemented in software (which may be implemented by computer program codes executable by the computing system), firmware, hardware, or an appropriate combination thereof. In a hardware implementation, the division between the functional modules/units mentioned in the above description may not necessarily correspond to the division of physical components; for example, one physical component may have multiple functions, or one function or step may be cooperatively executed by several physical components. Some or all physical components may be implemented as software executed by a processor, such as a central processor, a digital signal processor, or a microprocessor, or be implemented as hardware, or be implemented as an integrated circuit such as an application-specific integrated circuit.

In addition, as known to those skilled in the art, a communication medium typically includes computer-readable instructions, data structures, computer program modules, or other data in which data signals are modulated such as a carrier or other transmission mechanisms, and may include any information transferring medium. Therefore, the present disclosure is not limited to any combination of specific hardware and software.

The foregoing is detailed descriptions, made in conjunction with the specific implementations, of the embodiments of the present disclosure, and the specific embodiments of the present disclosure cannot be considered as being limited to these descriptions. For those of ordinary skill in the art to which the present disclosure is related, some simple deductions or substitutions may be made without departing from the concept of the present disclosure, and they should also be considered as falling within the scope of protection of the present disclosure.

What is claimed is:

1. A digital-to-analog conversion circuit, comprising:
   a conversion unit comprising a first code value receiving terminal, wherein the first code value receiving terminal is configured to receive a first code value, and the conversion unit is configured to convert the first code value into an analog signal; and a first adjustment unit comprising a second code value receiving terminal, wherein the second code value receiving terminal is used to receive a second code value, a first signal input terminal of the first adjustment unit is connected to a signal output terminal of the conversion unit, and the first adjustment unit is configured to: obtain a first analog adjustment signal according to the second code value, and adjust, with the first analog adjustment signal, the analog signal transmitted from the conversion unit, to obtain a target signal;

wherein the first adjustment unit comprises k third resistor-selection sub-units, each of the third resistor-selection sub-units comprises a third switch element and a fifth resistor, and the third switch element is connected in parallel to the fifth resistor.

2. The digital-to-analog conversion circuit of claim 1, wherein the digital-to-analog conversion circuit further comprises a second adjustment unit, the second adjustment unit comprises a third code value receiving terminal configured to receive a third code value; a signal output terminal of the second adjustment unit is connected to a second signal input terminal of the first adjustment unit; and the second adjustment unit is configured to obtain a second analog signal according to the third code value, and adjust, with the second analog signal, the analog signal transmitted by the conversion unit.

3. The digital-to-analog conversion circuit of claim 2, wherein the second adjustment unit comprises n first resistor-selection sub-units, a first resistor is provided between every two adjacent first resistor-selection sub-units, and the first resistor is electrically connected to its adjacent first resistor-selection sub-units.

4. The digital-to-analog conversion circuit of claim 3, wherein each of the first resistor-selection sub-units comprises a second resistor and a first switch element, a control terminal of the first switch element is configured to receive the third code value, a second connection terminal of the first switch element is connected to a first connection terminal of the second resistor, and a second connection terminal of the second resistor is connected to the first resistor.

5. The digital-to-analog conversion circuit of claim 4, wherein the control terminal of each first switch element is configured to receive a bit of the third code value;
when the received bit is 0, the first switch element is adapted to be controlled to be turned off and connected to a negative pole terminal of a reference voltage; and
when the received bit is 1, the first switch element is adapted to be controlled to be turned on and connected to a positive pole terminal of the reference voltage.

6. The digital-to-analog conversion circuit of claim 4, wherein the first switch element comprises a first inverter, a first PMOS transistor, and a first NMOS transistor, an input terminal of the first inverter is configured to receive the third code value, an output terminal of the first phase inverter is connected to each of a gate of the first PMOS transistor and a gate of the first NMOS transistor, a source of the first PMOS transistor is connected to a positive pole terminal of a reference voltage, a drain of the first PMOS transistor is connected to a drain of the first NMOS transistor, and a source of the first NMOS transistor is connected to a negative pole terminal of the reference voltage.

7. The digital-to-analog conversion circuit of claim 1, wherein the conversion unit comprises m second resistor-selection sub-units, a third resistor is provided between every two adjacent second resistor-selection sub-units, and the third resistor is electrically connected to its adjacent second resistor-selection sub-units.

8. The digital-to-analog conversion circuit of claim 7, wherein each of the second resistor-selection sub-units comprises a fourth resistor and a second switch element, a control terminal of the second switch element is configured to receive the first code value, a second connection terminal of the second switch element is connected to a first connection terminal of the fourth resistor, and a second connection terminal of the fourth resistor is connected to the third resistor.

9. The digital-to-analog conversion circuit of claim 8, wherein the control terminal of each second switch element is configured to receive a bit of the first code value;
when the received bit is 0, the second switch element is adapted to be controlled to be turned off and connected to a negative pole terminal of a reference voltage, and
when the received bit is 1, the second switch element is adapted to be controlled to be turned on and connected to a positive pole terminal of the reference voltage.

10. The digital-to-analog conversion circuit of claim 8, wherein the second switch element comprises a second inverter, a second PMOS transistor, and a second NMOS transistor, an input terminal of the second inverter is configured to receive the first code value, an output terminal of the second inverter is connected to each of a gate of the second PMOS transistor and a gate of the second NMOS transistor, a source of the second PMOS transistor is connected to a positive pole terminal of a reference voltage, a drain of the second PMOS transistor is connected to a drain of the second NMOS transistor, and a source of the second NMOS transistor is connected to a negative pole terminal of the reference voltage.

11. The digital-to-analog conversion circuit of claim 1, wherein a control terminal of each third switch element is configured to receive a bit of the second code value;
when the received bit is 0, the third switch element is adapted to be controlled to be turned off; and
when the received bit is 1, the third switch element is adapted to be controlled to be turned on, and the fifth resistor connected in parallel to the third switch element is short circuited.

12. The digital-to-analog conversion circuit of claim 1, wherein the third switch element comprises a third inverter, a third PMOS transistor, and a third NMOS transistor, an input terminal of the third inverter is configured to receive the second code value, an output terminal of the third inverter is connected to a gate of the third PMOS transistor, a source of the third PMOS transistor is connected to a drain of the third NMOS transistor, and a drain of the third PMOS transistor is connected to a source of the third NMOS transistor.

13. A digital-to-analog conversion method, implemented by a digital-to-analog conversion circuit comprising a conversion unit and a first adjustment unit, the method comprising:
receiving, by the conversion unit, a first code value, and converting the first code value into an analog signal;
receiving, by the first adjustment unit, a second code value;
obtaining, by the first adjustment unit, a first analog adjustment signal according to the second code value; and
adjusting, by the first adjustment unit with the first analog adjustment signal, the analog signal obtained from the conversion unit, to obtain a target signal;

wherein the first adjustment unit comprises k third resistor-selection sub-units, each of the third resistor-selection sub-units comprises a third switch element and a fifth resistor connected in parallel to each other, a control terminal of each third switch element is configured to receive a bit of the second code value, and the method further comprises:
- in response to detecting that the received bit is 0, controlling the third switch element to be turned off; and
- in response to detecting that the received bit is 1, controlling the third switch element to be turned on, to make the fifth resistor connected in parallel to the third switch element be short circuited.

14. The digital-to-analog conversion method of claim 13, wherein the digital-to-analog conversion circuit further comprises a second adjustment unit, and the method further comprises:
- receiving, by the second adjustment signal, a third code value;
- obtaining a second analog signal according to the third code value; and
- adjusting, with the second analog signal, the analog signal obtained by the conversion unit.

15. The digital-to-analog conversion method of claim 14, wherein the second adjustment unit comprises n first resistor-selection sub-units, a first resistor is electrically connected between every two adjacent first resistor-selection sub-units, each of the first resistor-selection sub-units comprises a second resistor and a first switch element, a control terminal of the first switch element is configured to receive a bit of the third code value, a second connection terminal of the first switch element is connected to a first connection terminal of the second resistor, a second connection terminal of the second resistor is connected to the first resistor, and the method further comprises:
- in response to detecting that the received bit is 0, controlling the first switch element to be turned off and connected to a negative pole terminal of a reference voltage; and
- in response to detecting that the received bit is 1, controlling the first switch element to be turned on and connected to a positive pole terminal of the reference voltage.

16. The digital-to-analog conversion method of claim 14, wherein the conversion unit comprises m second resistor-selection sub-units, a third resistor is electrically connected between every two adjacent second resistor-selection sub-units, each of the second resistor-selection sub-units comprises a fourth resistor and a second switch element, a control terminal of the second switch element is configured to receive a bit of the first code value, a second connection terminal of the second switch element is connected to a first connection terminal of the fourth resistor, and a second connection terminal of the fourth resistor is connected to the third resistor, and the method further comprises:
- in response to detecting that the received bit is 0, controlling the second switch element to be turned off and connected to a negative pole terminal of a reference voltage, and
- in response to detecting that the received bit is 1, controlling the second switch element to be turned on and connected to a positive pole terminal of a reference voltage.

* * * * *